United States Patent
Park et al.

(10) Patent No.: US 8,981,349 B2
(45) Date of Patent: Mar. 17, 2015

(54) ORGANIC LIGHT EMITTING DIODE DISPLAY

(75) Inventors: Soon-Ryong Park, Suwon-si (KR); Hee-Seong Jeong, Suwon-si (KR); Woo-Suk Jung, Suwon-si (KR); Jae-Yong Kim, Suwon-si (KR); Joo-Hwa Lee, Suwon-si (KR); Chul-Woo Jeong, Suwon-si (KR); Hee-Chul Jeon, Suwon-si (KR); Eun-Ah Kim, Suwon-si (KR); Noh-Min Kwak, Suwon-si (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 853 days.

(21) Appl. No.: 12/654,449

(22) Filed: Dec. 18, 2009

(65) Prior Publication Data

US 2010/0176382 A1 Jul. 15, 2010

(30) Foreign Application Priority Data

Jan. 9, 2009 (KR) .................. 10-2009-0001909

(51) Int. Cl.
*H01L 29/08* (2006.01)
*H01L 51/52* (2006.01)

(52) U.S. Cl.
CPC ........ *H01L 51/5271* (2013.01); *H01L 51/5281* (2013.01)
USPC ............................. 257/40; 438/99; 313/504

(58) Field of Classification Search
USPC ............. 257/E33.067, E33.071–E33.073, 40; 313/504; 438/99
See application file for complete search history.

(56) References Cited

U.S. PATENT DOCUMENTS

| 5,830,267 | A  | * | 11/1998 | Zambounis et al. | .......... | 106/413 |
| 6,297,864 | B1 |   | 10/2001 | Kaneko et al. | | |
| 6,841,803 | B2 |   | 1/2005  | Aizawa et al. | | |
| 7,732,809 | B2 | * | 6/2010  | Adachi et al. | .................. | 257/40 |
| 2003/0127656 | A1 | * | 7/2003 | Aizawa et al. | .................. | 257/79 |
| 2004/0076853 | A1 | * | 4/2004 | Jarikov | ......................... | 428/690 |
| 2005/0116621 | A1 | * | 6/2005 | Bellmann et al. | ............. | 313/503 |
| 2006/0114371 | A1 |   | 6/2006 | Peterson et al. | | |

(Continued)

FOREIGN PATENT DOCUMENTS

| JP | 2001357979 A | 12/2001 |
| JP | 2003121835 A | 4/2003 |
| JP | 2003186413 A | 7/2003 |

(Continued)

OTHER PUBLICATIONS

In situ resonance Raman spectra of carotenoids in bird's feathers, M. Veronelli, G Zerbi, R Stradi, Journal of Raman Spectroscopy, 1995.*

(Continued)

*Primary Examiner* — Mark Tornow
(74) *Attorney, Agent, or Firm* — Robert E. Bushnell, Esq.

(57) ABSTRACT

An organic light emitting diode display device constructed with an organic light emitting element including a first electrode, an organic emission layer, and a second electrode sequentially laminated together, a transmittance control layer formed on the organic light emitting element, a selective reflective layer formed on the transmittance control layer, a polarizing plate formed on the selective reflective layer, and a phase retardation plate disposed between the organic light emitting element and the polarizing plate.

13 Claims, 7 Drawing Sheets

(56) References Cited

U.S. PATENT DOCUMENTS

2007/0080417 A1* 4/2007 Jung et al. .................... 257/448
2008/0186428 A1* 8/2008 Sakamoto et al. ............. 349/62

FOREIGN PATENT DOCUMENTS

| JP | 2004-086145 | | 3/2004 |
| JP | 2004296162 | A | 10/2004 |
| KR | 1020020061474 | A | 7/2002 |
| KR | 1020050018401 | A | 2/2005 |

OTHER PUBLICATIONS

Synthesis and Electronic Spectra of Some Disperse Dyes Derived from 9-Phenylazo-1-ketojulolidine, Geoffrey Hallas, Kwok Leung Ng, Journal of the Society of Dyers and Colourists, vol. 93, Issue 7, pp. 284-287, Jul. 1977.*

Synthesis and spectral properties of some N-substituted derivatives of phenol blue, J. Figueras, P. W. Schullard, A. R. Mack, J. Org. Chem., 1971, 36 (23), pp. 3497-3501, Nov. 1971.*

Korean Notice of Allowance dated Mar. 29, 2010, in corresponding Korean Priority Application No. 10-2009-0001909.

* cited by examiner

ORGANIC LIGHT EMITTING DIODE DISPLAY

CLAIM OF PRIORITY

This application makes reference to, incorporates into this specification the entire contents of, and claims all benefits accruing under 35 U.S.C. §119 from an application earlier filed in the Korean Intellectual Property Office on Jan. 9, 2009, and there duly assigned Serial No. 10-2009-0001909.

BACKGROUND OF THE INVENTION

1. Field of the Invention

The present invention relates to an organic light emitting diode (OLED) display device. More particularly, the present invention relates to an organic light emitting diode (OLED) display device having improved display characteristics.

2. Description of the Related Art

An organic light emitting diode display device includes a plurality of organic light emitting diodes that include hole injection electrodes, organic emission layers, and electron injection electrodes. Energy is produced when excitons generated by combination of holes and electrons in the organic emission layer transit from an excited state to a ground state to emit light, such that the organic light emitting diode display device forms visual images.

Therefore, the organic light emitting diode display device has a self-emission characteristic. Unlike a liquid crystal display device, since the organic light emitting diode display device does not require an additional light source, the thickness and weight of the organic light emitting diode display device can be reduced. Further, since the organic light emitting diode (OLED) display device shows high-quality characteristics such as low power consumption, high luminance, and high reaction speed, the organic light emitting diode display device has attracted considerable attention as a next-generation display device for a portable electronic apparatus.

In general, one or more of the hole injection electrodes and the electron injection electrodes, and various other metal wires that are disposed in the organic light emitting diode display device, can reflect light inputted from the outside. Accordingly, when the organic light emitting diode display device is used in a bright environment, representation and contrast of a black color are undesirably deteriorated due to external light reflection.

In order to solve the problem, a polarizing plate and a phase retardation plate are disposed on an organic light emitting element to suppress the external light reflection. A known method of suppressing the external light reflection by means of the polarizing plate and the phase retardation plate has a problem, however, in that a large amount of light generated from the organic emission layer is lost when being discharged to the outside through the polarizing plate and the phase retardation plate.

The above information disclosed in this Background section is only for enhancement of understanding of the background of the invention and therefore it may contain information that does not form the prior art that is already known in this country to a person of ordinary skill in the art.

SUMMARY OF THE INVENTION

It is therefore an object of the present invention to provide an improved organic light emitting diode.

It is another object to provide an organic light emitting diode exhibiting improved display characteristics.

It is still another object to provide an organic light emitting diode capable of minimizing loss of light emitted from an organic emission layer to the outside while improving visibility by suppressing external light reflection.

According to one aspect of the present invention, an organic light emitting diode display device may be constructed with an organic light emitting element including a first electrode, an organic emission layer, and a second electrode sequentially laminated together, a transmittance control layer formed on the organic light emitting element, a selective reflective layer formed on the transmittance control layer, a polarizing plate formed on the selective reflective layer, and a phase retardation plate disposed between the organic light emitting element and the polarizing plate.

The selective reflective layer may be a cholesteric liquid crystal layer, and the phase retardation plate may be disposed between the polarizing plate and the cholesteric liquid crystal layer.

The cholesteric liquid crystal layer may pass one of left circular polarized light and right circular polarized light and reflect the other one of the left circular polarized light and the right circular polarized light.

Light that is linearly polarized through the polarizing plate may be converted into circular polarized light while passing through the phase retardation plate.

The phase retardation plate is a ¼ wavelength plate, and an intersection angle between an optical axis of the phase retardation plate and a polarization axis of the polarizing plate may be 45 degrees.

The selective reflective layer may be a dual brightness enhancement film, and the phase retardation plate may be disposed between the organic light emitting element and the transmittance control layer or between the transmittance control layer and the dual brightness enhancement film.

The polarizing plate may have the same polarization axis as the dual brightness enhancement film.

Light that is linearly polarized through the dual brightness enhancement film may be converted into the circular polarized light while passing through the phase retardation plate.

The phase retardation plate is a ¼ wavelength plate, and the intersection angle between the optical axis of the phase retardation plate and the polarization axis of the polarizing plate may be 45 degrees.

In the organic light emitting diode display device, the transmittance control layer may be made of a resin containing the light absorption material.

Transmittance of light of the transmittance control layer may be controlled depending on the kind and content of the light absorption material.

The transmittance control layer may have a selective transmittance for each wavelength band of the light.

The resin may include at least one of polycarbonate, polymethyl methacrylate (PMMA), polyether sulfone (PES), polyethylene terephthalate (PET), and triacetate cellulose (TAC).

The light absorption material may include at least one of carbon black, a polyene-based pigment, an azo-based pigment, an azomethine-based pigment, a diimmonium-based pigment, a phthalocyanine-based pigment, a quinine-based pigment, an indigo-based pigment, a thioindigo-based pigment, a dioxadin-based pigment, a quinacridone-based pigment, an isoindolinone-based pigment, a metal oxide, a metal complex, and other aromatic hydrocarbons.

The polyene-based pigment may include at least one of compounds of the following Chemical Formulas 1 and 2.

Chemical Formula 1

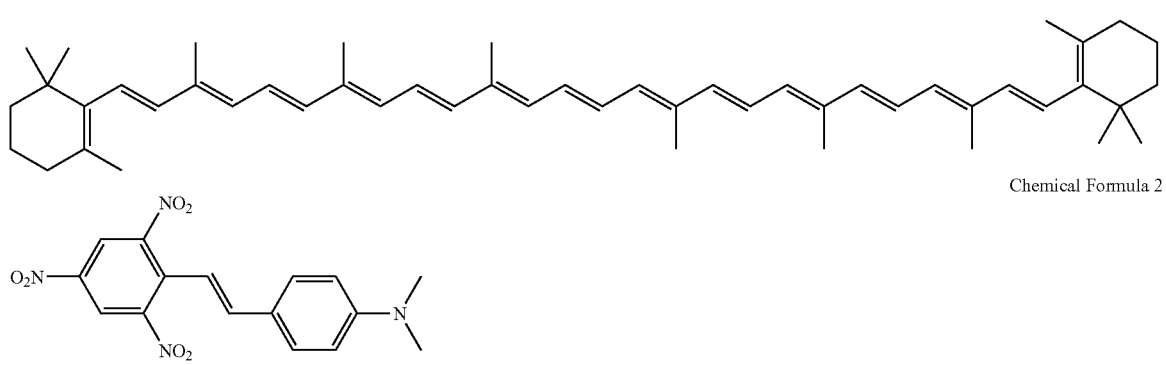

Chemical Formula 2

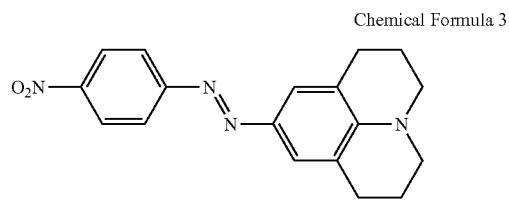 [SMILES: O=[N+]([O-])c1ccc(/N=N/c2cc3c4c(c2)CCCN4CCC3)cc1]

The azo-based pigment may include a compound of the following Chemical Formula 3.

Chemical Formula 3

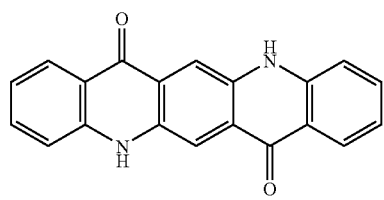

The quinacridone-based pigment may include at least one of compounds of the following Chemical Formulas 4 and 5.

Chemical Formula 4

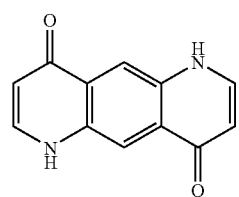

Chemical Formula 5

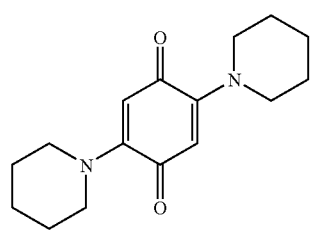

The quinine-based pigment may include at least one of compounds of the following Chemical Formulas 6 to 8.

Chemical Formula 6

-continued

Chemical Formula 7

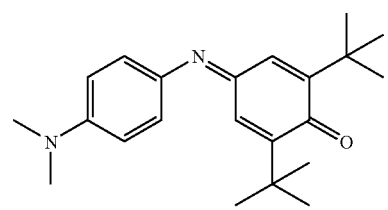

Chemical Formula 8

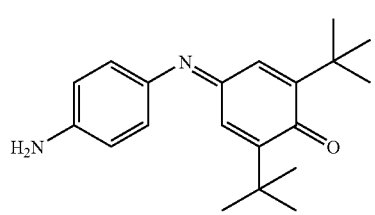

The indigo-based pigment may include at least one of compounds of the following Chemical Formulas 9 to 11.

Chemical Formula 9

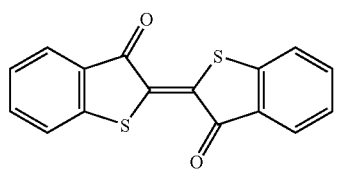

Chemical Formula 10

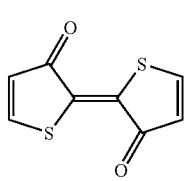

Chemical Formula 11

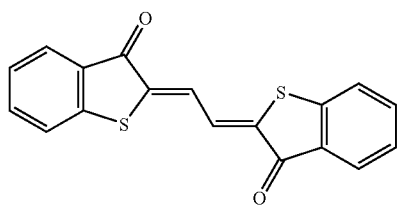

The aromatic hydrocarbons may include at least one of compounds of Chemical Formulas 12 to 18.

Chemical Formula 12

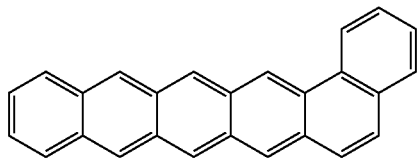

Chemical Formula 13

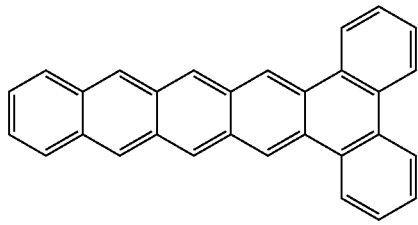

Chemical Formula 14

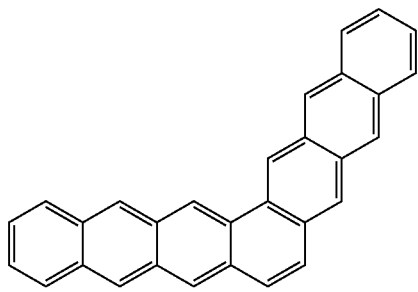

Chemical Formula 15

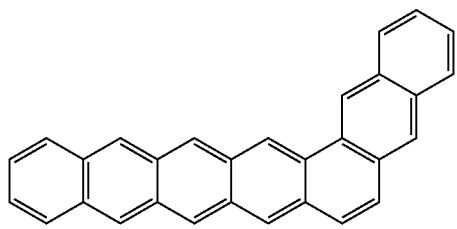

Chemical Formula 16

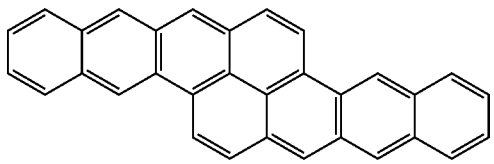

Chemical Formula 17

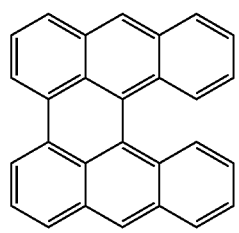

Chemical Formula 18

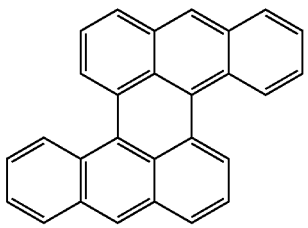

Therefore, the organic light emitting diode display device can minimize loss of light emitted from the organic emission layer to the outside while improving visibility by suppressing external light reflection.

Further, the organic light emitting diode display device can selectively control transmittance for each wavelength band of the light.

Further, the organic light emitting diode display device can reduce power consumption and extend the lifespan thereof.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

Figure 1:
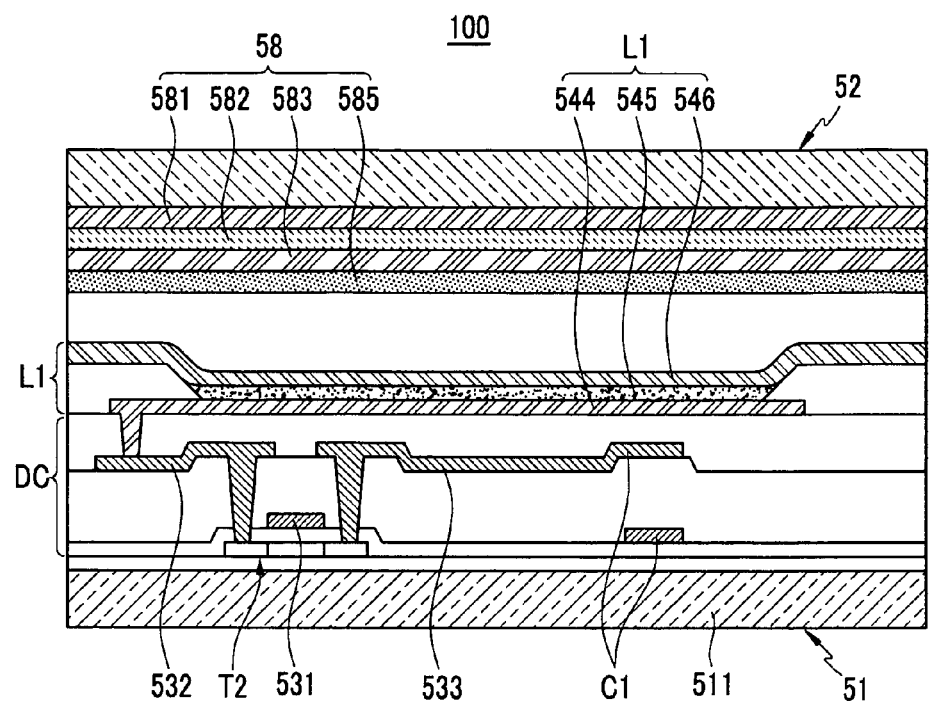
FIG. 1 is a cross-sectional view of an organic light emitting diode display device constructed as a first exemplary embodiment according to the principles of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, since sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In order to clarify the present invention, elements extrinsic to the description are omitted and like reference numerals refer to like elements throughout the specification.

Further, in several exemplary embodiments, constituent elements having the same configuration are representatively described in a first exemplary embodiment by using the same reference numeral and only constituent elements other than the constituent elements described in the first exemplary embodiment will be described in other embodiments.

Hereinafter, a first exemplary embodiment of the present invention will be described with reference to FIGS. 1 and 2.

As shown in FIG. 1, organic light emitting diode display device 100 constructed as the first exemplary embodiment according to the principles of the present invention includes a first substrate 51, a second substrate 52, and an optical member 58 that are bonded with each other.

First substrate 51 includes a substrate member 511, a driving circuit DC formed on substrate member 511, and an organic light emitting element L1 formed on driving circuit DC.

Figure 2:
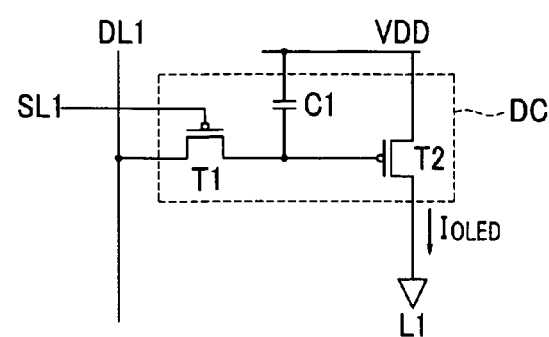
FIG. 2 is a layout view illustrating a circuit layout of a driving circuit and an organic light emitting element of the organic light emitting diode display device of FIG. 1.

Driving circuit DC generally has a layout structure shown in FIG. 2. That is, as shown in FIG. 2, driving circuit DC includes two or more thin film transistors T1 and T2 and one or more storage capacitors C1. The thin film transistor basically includes a switching transistor T1 and a driving transistor T2.

Switching transistor T1 is connected to a scan line SL1 and a data line DL1 to transmit a data voltage inputted from data line DL1 to driving transistor T2 depending on a switching voltage inputted to scan line SL1. Storage capacitor C1 is connected to switching transistor T1 and a power supply line VDD to store a voltage corresponding to a difference between a voltage transmitted from switching transistor T1 and a voltage supplied from power supply line VDD.

Driving transistor T2 is connected to power supply line VDD and storage capacitor C1 to supply an output current $I_{OLED}$ that is proportional to the square of a difference between the voltage stored in storage capacitor C1 and a threshold voltage to organic light emitting element L1, and organic light emitting element L1 emits light by output current $I_{OLED}$.

Referring back to FIG. 1, driving transistor T2 includes a source electrode 533, a drain electrode 532, and a gate electrode 531.

Organic light emitting element L1 includes a first electrode 544, an organic emission layer 545 formed on first electrode 544, and a second electrode 546 formed on organic emission layer 545. In general, first electrode 544 becomes an anode electrode and second electrode 546 becomes a cathode electrode. The first exemplary embodiment of the present invention is not, however, limited thereto, and first electrode 544 may become the cathode electrode and second electrode 546 may become the anode electrode according to a driving method. In addition, first electrode 544 of organic light emitting element L1 is connected to drain electrode 532 of driving transistor T2. One or more of first electrode 544 and second electrode 546 is formed in a semi-transmissive or reflective form to reflect light.

Further, in organic light emitting diode display device 100 according to the first exemplary embodiment of the present invention, organic light emitting element L1 emits light from organic emission layer 545 to second electrode 546 to display images. That is, organic light emitting diode display device 100 is formed as a top emission type.

The configurations of driving circuit DC and organic light emitting element L1 are not limited to the above-mentioned example, but may be modified in various known configurations that can be implemented by those skilled in the art.

Optical member 58 serves to minimize loss of light emitted from organic light emitting element L1 to the outside while improving visibility of organic light emitting diode display device 100 by suppressing external light reflection. Optical member 58 includes a transmittance control layer 585, a selective reflective layer 583, a phase retardation plate 582, and a polarizing plate 581. In organic light emitting diode display device 100 according to the first exemplary embodiment of the present invention, transmittance control layer 585, selective reflective layer 583, phase retardation plate 582, and polarizing plate 581 of optical member 58 are arranged adjacent to organic light emitting element L1 in sequence.

Polarizing plate 581 has a polarization axis and linearly polarizes light in a polarizing-axis direction. More specifically, polarizing plate 581 passes light parallel to the polarization axis and absorbs light not parallel to the polarization axis. Therefore, when light passes through polarizing plate 581, the light is linearly polarized in the polarizing-axis direction.

Phase retardation plate 582 is a ¼ wavelength plate. Phase retardation plate 582 has an optical axis that deviates from the polarization axis of polarizing plate 581 by approximately 45 degrees. That is, an intersection angle between the optical axis of phase retardation plate 582 and the polarization axis of polarizing plate 581 is approximately 45 degrees. As a result, the linear polarized light passing through polarizing plate 581 becomes circular polarized light while passing through phase retardation plate 582. As the intersection angle between the optical axis of phase retardation plate 582 and the polarization axis of polarizing plate 581 becomes closer to 45 degrees, the linear polarized light passing through polarizing plate 581 substantially becomes the circular polarized light while passing through phase retardation plate 582.

A cholesteric liquid crystal (CLC) layer is used as selective reflective layer 583. Hereinafter, in the first exemplary embodiment of the present invention, the selective reflective layer is referred to as a cholesteric liquid crystal layer 583.

Although cholesteric liquid crystals have a layered structure like smectic liquid crystals, molecules along a long axis have an equilibrium arrangement similar to nematic liquid crystals in a plane. More specifically, the cholesteric liquid crystals have a structure in which elongated molecules are arranged in order in a long axis direction in one plane and an arrangement orientation of a molecular axis is slightly deviated in a direction vertical to the plane, that is, a structure in which a molecular arrangement orientation circles as a helical curve. Therefore, the liquid crystals have a helical structure on the whole. As a result, the cholesteric liquid crystals have certain characteristics, such as optical rotary power, selective light dispersion, and circular dichroism.

Accordingly, cholesteric liquid crystal layer 583 may selectively transmit or reflect circular polarized light. As an example, cholesteric liquid crystal layer 583 may transmit right circular polarized light and reflect left circular polarized light.

Transmittance control layer 585 absorbs some passing light to control transmittance. Transmittance control layer 585 is made of a resin containing a light absorption material. Accordingly, transmittance control layer 585 can control a transmittance of light in accordance with the kind and content of the light absorption material.

Transmittance control layer 585 includes at least one of resin among polycarbonate, polyether sulfone (PES), polymethyl methacrylate (PMMA), polyethylene terephthalate (PET), and triacetate cellulose (TAC).

Further, transmittance control layer 585 includes at least one light absorption material among carbon black, a polyene-based pigment, an azo-based pigment, an azomethine-based pigment, a diimmonium-based pigment, a phthalocyanine-based pigment, a quinine-based pigment, an indigo-based pigment, a thioindigo-based pigment, a dioxadin-based pigment, a quinacridone-based pigment, an isoindolinone-based pigment, a metal oxide, a metal complex, and other aromatic hydrocarbons.

In this way, transmittance control layer 585 may include at least one of various light absorption materials. The light absorption material absorbs light having a predetermined wavelength band according to the kind of the light absorption material. Accordingly, transmittance control layer 585 may have a selective transmittance for each wavelength band according to the kind of light absorption material. That is, transmittance control layer 585 may include at least one among the above-mentioned light absorption materials so as to control the transmittance of light on the basis of a color having a predetermined wavelength band by considering a primary color included in external light, which suppresses reflection or the state of the light emitted from organic light emitting element L1.

Hereinafter, several materials among the light absorption materials that may be used for transmittance control layer 585 will be described in detail as examples. Transmittance control layer 585 includes one or more light absorption materials to be described below to selectively control transmittance in a predetermined wavelength band.

First, the polyene-based pigment includes a compound represented by at least one of the following Chemical Formula 1 and Chemical Formula 2.

Herein, Chemical Formula 1 represents dodecapreno-beta-carotene, which can absorb light having a wavelength in the range of approximately 480 nm to 530 nm. Further, Chemical Formula 2 represents trans-stilbenes, which can absorb light having a wavelength of approximately 525 nm.

Next, the azo-based pigment includes a compound represented by the following Chemical Formula 3.

Chemical Formula 3

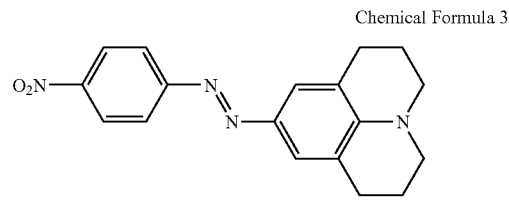 [SMILES: O=[N+]([O-])c1ccc(/N=N/c2cc3c4c(c2)CCCN4CCC3)cc1]

Herein, the compound of Chemical Formula 3 can absorb light having a wavelength of approximately 518 nm.

Next, the quinacridone-based pigment includes a compound represented by at least one of the following Chemical Formula 4 and Chemical Formula 5.

Chemical Formula 4

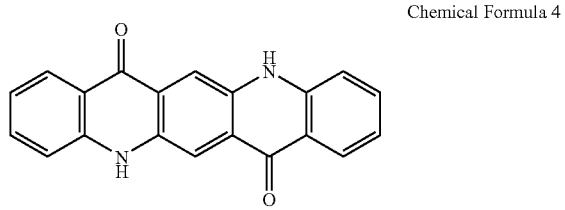

Chemical Formula 5

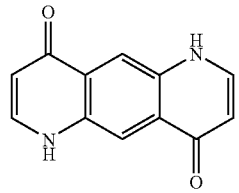

Herein, the compound of Chemical Formula 4 can absorb light having a wavelength of approximately 523 nm, and the compound of Chemical Formula 5 can absorb light having a wavelength of approximately 528 nm.

Next, the quinacridone-based pigment includes a compound represented by at least one of the following Chemical Formula 6 to Chemical Formula 8.

Chemical Formula 1

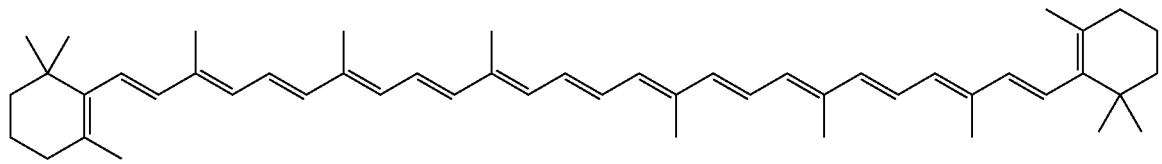

Chemical Formula 2

Chemical Formula 6

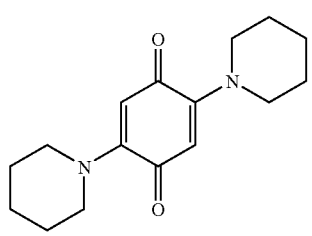

Chemical Formula 7

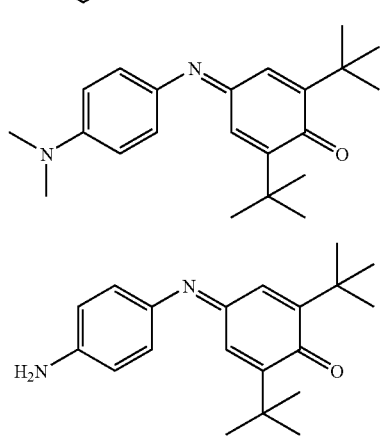

Chemical Formula 8

Herein, the compound of Chemical Formula 6 can absorb light having a wavelength of approximately 528 nm, the compound of Chemical Formula 7 can absorb light having a wavelength of approximately 549 nm, and the compound of Chemical Formula 8 can absorb light having a wavelength of approximately 508 nm.

Next, the indigo-based pigment includes a compound represented by at least one of the following Chemical Formula 9 to Chemical Formula 11.

Chemical Formula 9

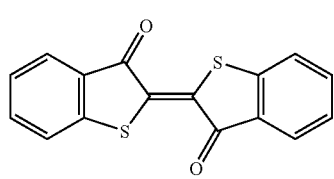

Chemical Formula 10

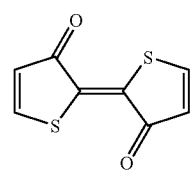

Chemical Formula 11

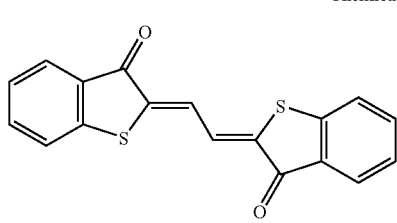

Herein, the compound of Chemical Formula 9 can absorb light having a wavelength of approximately 546 nm, the compound of Chemical Formula 10 can absorb light having a wavelength of approximately 505 nm, and the compound of Chemical Formula 11 can absorb light having a wavelength of approximately 534 nm.

Next, the aromatic hydrocarbons include a compound represented by at least one of the following Chemical Formula 12 to Chemical Formula 18.

Chemical Formula 12

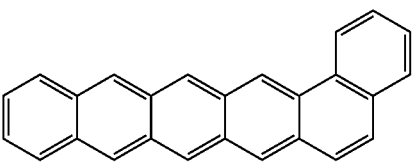

Chemical Formula 13

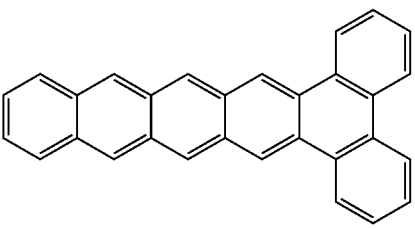

Chemical Formula 14

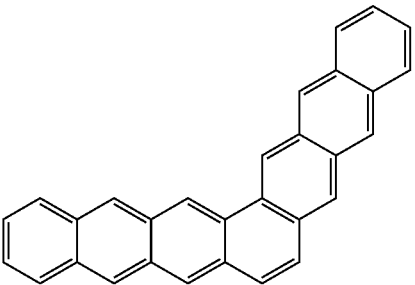

Chemical Formula 15

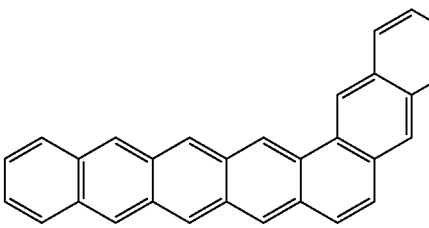

Chemical Formula 16

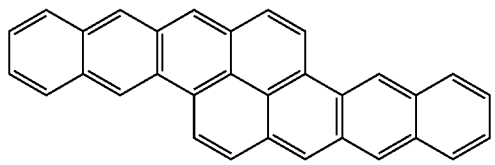

Chemical Formula 17

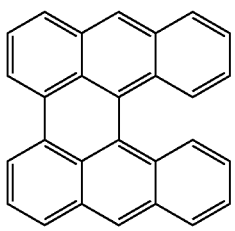

-continued

Chemical Formula 18

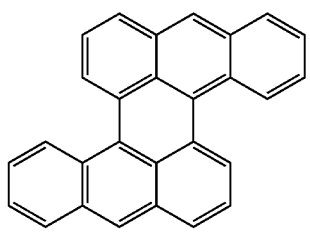

Herein, the compound of Chemical Formula 12 can absorb light having a wavelength of approximately 523 nm, and the compound of Chemical Formula 13 can absorb light having a wavelength of approximately 512 nm. Further, the compound of Chemical Formula 14 can absorb light having a wavelength of approximately 510 nm, and the compound of Chemical Formula 15 can absorb light having a wavelength of approximately 519 nm. Further, the compound of Chemical Formula 16 can absorb light having a wavelength of approximately 534 nm, the compound of Chemical Formula 17 can absorb light having a wavelength of approximately 523 nm, and the compound of Chemical Formula 18 can absorb light having a wavelength of approximately 521 nm.

Second substrate 52 covers first substrate 51 on which organic light emitting element L1 and driving circuit DC are formed. That is, second substrate 52 is arranged opposite to and covers first substrate 51, such that thin film transistors T1 and T2, storage capacitor C1, and organic light emitting element L1 are sealed from the outside. At this time, second substrate 52 is bonded with first substrate 51 by a sealant (not shown) formed on the edge to seal a space between substrates 51 and 52.

Further, second substrate 52 also covers optical member 58 formed on organic light emitting element L1. However, the present invention is not limited thereto. As a result, optical member 58 may be formed on second substrate 52. That is, optical member 58 may be disposed outside of the sealed space formed by bonding first substrate 51 and second substrate 52 to each other. As such, optical member 58 may be arbitrarily disposed on organic light emitting element L1.

By this configuration, organic light emitting diode display device 100 can minimize loss of light emitted from organic emission layer 545 to the outside while improving visibility by suppressing the external light reflection. Further, organic light emitting diode display device 100 can selectively control transmittance for each wavelength band of the light.

Accordingly, organic light emitting diode display device 100 can have improved luminance due to an increase of overall use efficiency. Further, organic light emitting diode display device 100 can reduce power consumption and extend the lifespan thereof.

Hereinafter, referring to FIGS. 3 and 4, a principle will be described in which optical member 58 of organic light emitting diode display device 100 according to the first exemplary embodiment of the present invention minimizes the loss of the light emitted from organic emission layer 545 to the outside while effectively suppressing the external light reflection.

Figure 3:
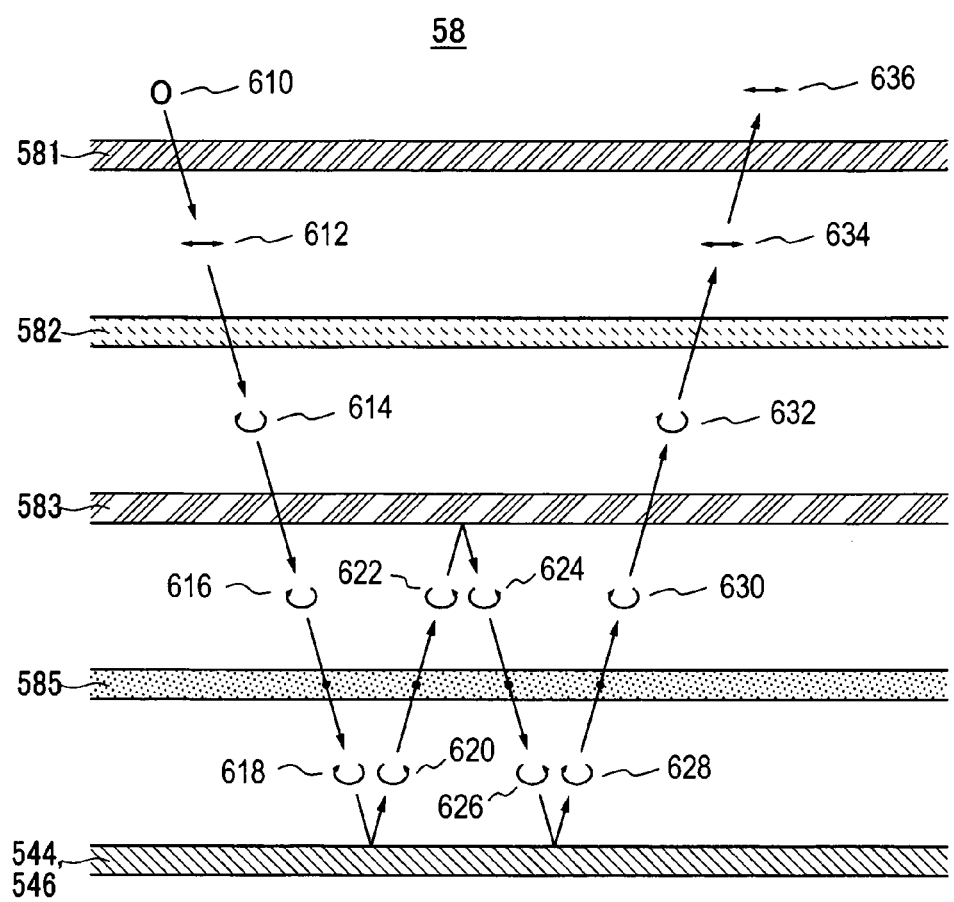
FIG. 3 is a configuration diagram illustrating the path of light inputted into the organic light emitting diode display device of FIG. 1.

First, referring to FIG. 3, the path of light, which is inputted from the outside through optical member 58, is described.

External light 610 is linearly polarized in a polarization-axis direction of polarizing plate 581 while passing through polarizing plate 581. Linear polarized light 612 is converted into circular polarized light 614 while passing through phase retardation plate 582, which is a ¼ wavelength plate. At this time, the optical axis of phase retardation plate 582 deviates from the polarization axis of polarizing plate 581 by 45 degrees. That is, the intersection angle between the optical axis of phase retardation plate 582 and the polarization axis of polarizing plate 581 is 45 degrees.

As such, since an intersection angle between an axial direction of linear polarized light 612 and an optical axis direction of phase retardation plate 582 is 45 degrees, linear polarized light 612 is converted into circular polarized light 614 while passing through phase retardation plate 582. At this time, circular polarized light 614 is a right circular polarized light. However, the exemplary embodiment of the present invention is not limited thereto. Accordingly, phase retardation plate 582 may be disposed such that the light passing through phase retardation plate 582 becomes the left circular polarized light.

Right circular polarized light 614 passes through cholesteric liquid crystal layer 583. Cholesteric liquid crystal layer 583 serves to pass the right circular polarized light and reflect the left circular polarized light. However, the exemplary embodiment of the present invention is not limited thereto. Accordingly, cholesteric liquid crystal layer 583 may pass the left circular polarized light and reflect the right circular polarized light. However, in this case, the light passing through the phase retardation plate 582 must be the left circular polarized light. That is, cholesteric liquid crystal layer 583 must be able to pass the circular polarized light through polarizing plate 581 and phase retardation plate 582.

Right circular polarized light 616 passing through cholesteric liquid crystal layer 583 is reflected by electrodes 544 and 546 of organic light emitting element L1 while being partially eliminated while passing through transmittance control layer 585. Further, the light may be reflected by various other metal wires in addition to electrodes 544 and 546 of organic light emitting element L1. At this time, transmittance control layer 585 may equally absorb and eliminate some of passing light 618 for each wavelength band or selectively absorb and eliminate some of passing light 618 for each wavelength band in accordance with the kind of optical absorption material included in transmittance control layer 585.

Right circular polarized light 618 passing through transmittance control layer 585 is reflected by electrodes 544 and 546 of organic light emitting element L1 or various other metal wires to thereby be converted into left circular polarized light 620 by a phase of 180 degrees. Further, left circular polarized light 620 goes toward cholesteric liquid crystal layer 583 through transmittance control layer 585 again. Even at this time, light 622 is partially eliminated while passing through transmittance control layer 585, as described above.

Left circular polarized light 622 re-passing through transmittance control layer 585 is reflected by cholesteric liquid crystal layer 583. The reflected left circular polarized light 624 goes toward transmittance control layer 585 again. Further, left circular polarized light 626 re-passing through transmittance control layer 585 is reflected by electrodes 544 and 546 of organic light emitting element L1 or various other metal wires again to thereby be phase-converted into right circular polarized light 628.

Right circular polarized light 628 goes toward transmittance control layer 585 again and light 630 passing through transmittance control layer 585 goes toward phase retardation plate 582 through cholesteric liquid crystal 583.

Right circular polarized light 632 passing through cholesteric liquid crystal layer 583 is converted into linear polarized light 634 while passing through phase retardation plate 582. At this time, since an axial direction of linear polarized light 634 is substantially parallel to the polarizing-axis direction of polarizing plate 581, linear polarized light 636 goes outwards through polarizing plate 581.

As such, after the external light passes through optical member 58, the external light passes through transmittance control layer 585 a total of four times when the external light is reflected by electrodes 544 and 546 of organic light emitting element L1 or various other metal wires, and goes toward the outside through optical member 58. The external light is substantially eliminated while passing through transmittance control layer 585. That is, a large amount of external light is eliminated while passing through transmittance control layer 585.

At this time, transmittance control layer 585 may selectively absorb and eliminate only light of a predetermined wavelength band among the external light.

By this configuration, organic light emitting diode display device 100 may suppress the external light reflection.

Figure 4:
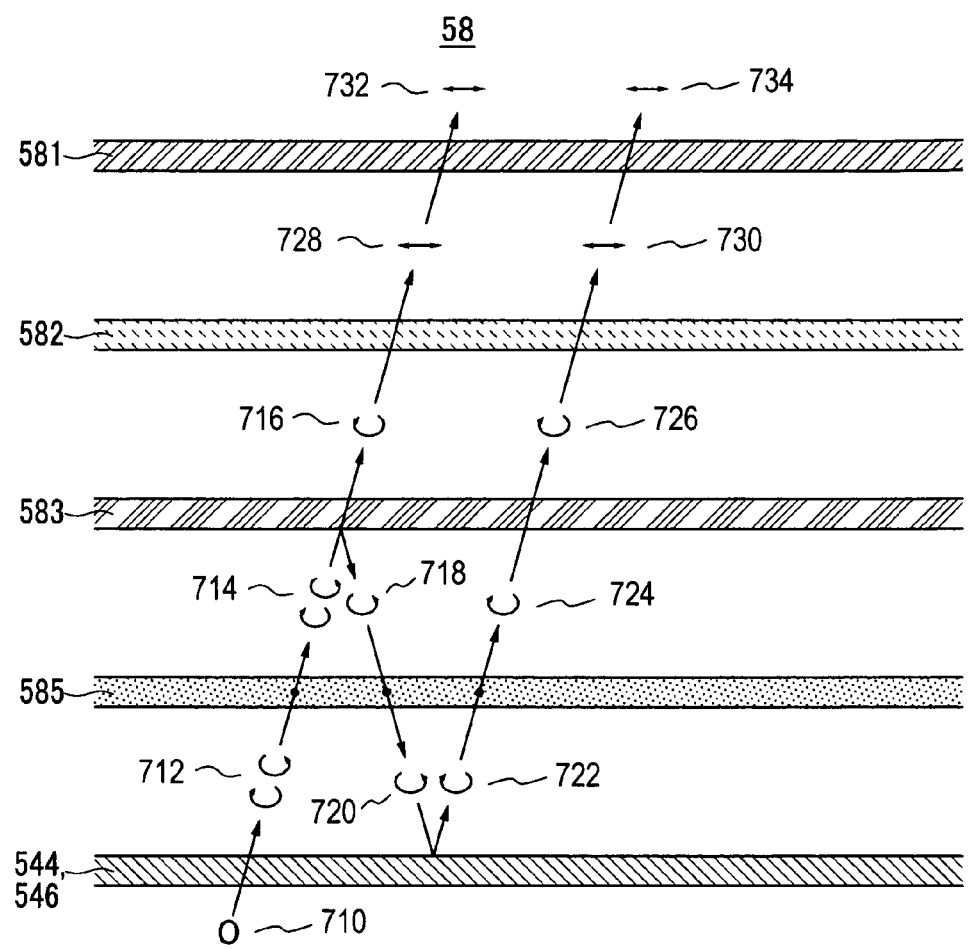
FIG. 4 is a configuration diagram illustrating the path through which light generated from the organic light emitting element of the organic light emitting diode display device of FIG. 1 is emitted to the outside.

Referring to FIG. 4, the path of the light emitted from organic emission layer 545 (shown in FIG. 1) to the outside will be described.

Light 710 emitted from organic emission layer 545 goes toward cholesteric liquid crystal layer 583 through second electrode 546 and transmittance control layer 585. At this time, various phases coexist in the light. Further, light 714 is partially eliminated while passing through transmittance control layer 585.

Light 716 having a right circular polarized light component among light 714 passing through transmittance control layer 585 goes toward phase retardation plate 582 through cholesteric liquid crystal layer 583, and light 718 having a left circular polarized light component is reflected to go toward transmittance control layer 585. Herein, light 718 having the left circular polarized light component, which is reflected by cholesteric liquid crystal layer 583, passes through transmittance control layer 585, and is converted into right circular polarized light 722 while being reflected by electrodes 544 and 546 of organic light emitting element L1 or various other metal wires through transmittance control layer 585. Right circular polarized light 722 goes toward phase retardation plate 582 through transmittance control layer 585 and cholesteric layer 583 in sequence again. That is, the light generated from organic light emitting element L1 reaches phase retardation plate 582 through transmittance control layer 585 either once or three times.

Right circular polarized lights 716 and 726 passing through cholesteric liquid crystal layer 583 are converted into linear polarized lights 728 and 730 while passing through phase retardation plate 582. At this time, since an axial direction of linear polarized light 634 is substantially parallel to the polarizing-axis direction of polarizing plate 581, linear polarized lights 732 and 734 go outwards through polarizing plate 581.

As such, in the case of organic light emitting diode display device 100 according to the first exemplary embodiment of the present invention, when the light inputted from the outside is emitted to the outside again by being reflected, the external light passes through transmittance control layer 585 a total of four times, while the light generated from organic light emitting element L1 passes through transmittance control layer 585 either once or three times. That is, transmittance control layer 585 has a large advantage of suppressing the external light reflection, while the amount of light lost in transmittance control layer 585 is relatively low when the light generated from organic light emitting element L1 is emitted to the outside.

Organic light emitting diode display device 100 can minimize loss of light emitted from organic emission layer 545 to the outside while effectively suppressing the external light reflection.

Further, organic light emitting diode display device 100 can efficiently emit the light generated from organic emission layer 545 to thereby improve luminance, reduce power consumption, and extend the lifespan.

Hereinafter, referring to FIG. 5, a second exemplary embodiment of the principles of the present invention will be described.

Figure 5:
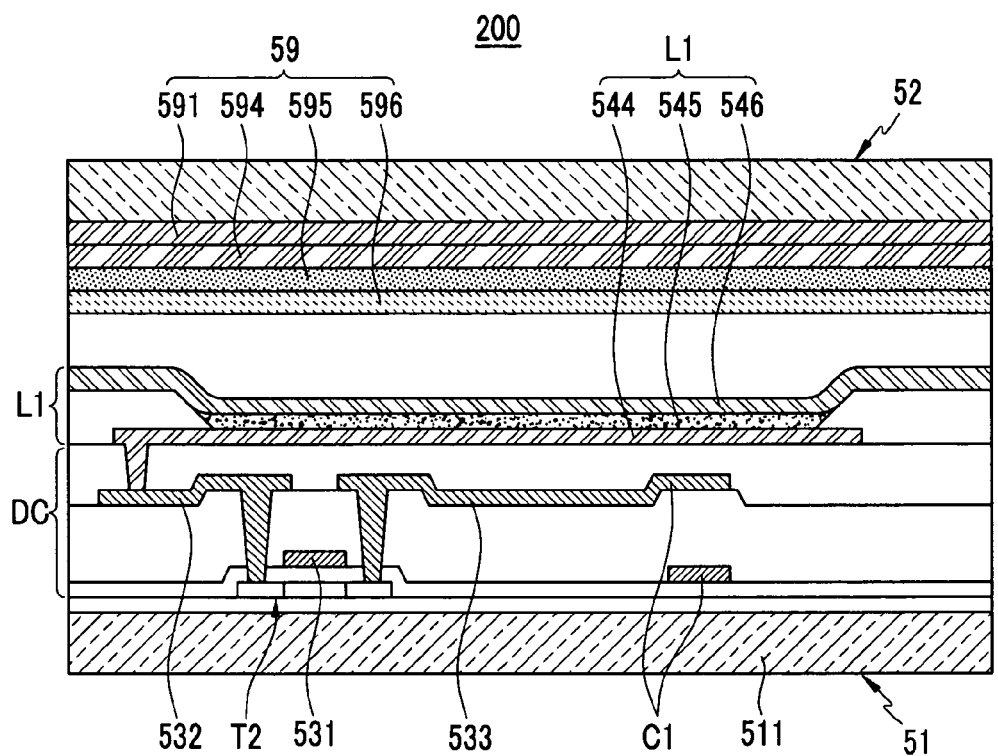
FIG. 5 is a cross-sectional view of an organic light emitting diode display device constructed as a second exemplary embodiment according to the principles of the present invention.

As shown in FIG. 5, an organic light emitting diode display device 200 constructed as the second exemplary embodiment according to the principles of the present invention includes a first substrate 51, a second substrate 52, and an optical member 59.

Optical member 59 includes a phase retardation plate 596, a transmittance control layer 595, a selective reflective layer 594, and a polarizing plate 591. In organic light emitting diode display device 200 according to the second exemplary embodiment of the present invention, phase retardation plate 596, transmittance control layer 595, selective reflective layer 584, and polarizing plate 591 of optical member 59 are arranged adjacent to an organic light emitting element L1 in sequence. The position of phase retardation plate 596 is not, however, limited to the above-mentioned position, but phase retardation plate 596 may be positioned between transmittance control layer 595 and selective reflective layer 594.

A dual brightness enhancement brightness film (DBEF) is used as selective reflective layer 594. Hereinafter, in the second exemplary embodiment of the present invention, the selective reflective layer is referred to as dual brightness enhancement film 594.

Dual brightness enhancement film (DBEF) 594 passes light that is parallel to a polarization axis and reflects light that is not parallel to the polarization axis. That is, polarizing plate 591 is different from dual brightness enhancement film 594 in that polarizing plate 591 absorbs the light that is not parallel to the polarization axis.

Polarizing plate 591 has a polarization axis of the same direction as dual brightness enhancement film 594. Further, an intersection angle between an optical axis of phase retardation plate 596 and the polarization axis of dual brightness enhancement film 594 is 45 degrees.

Transmittance control layer 595 is described in detail in the first exemplary embodiment explained above.

By this configuration, organic light emitting diode display device 200 can minimize loss of light emitted from organic emission layer 545 to the outside while improving visibility by effectively suppressing external light reflection.

Further, organic light emitting diode display device 200 can efficiently emit the light generated from organic emission layer 545 to the outside to thereby improve luminance, reduce power consumption, and extend the lifespan.

Figure 6:
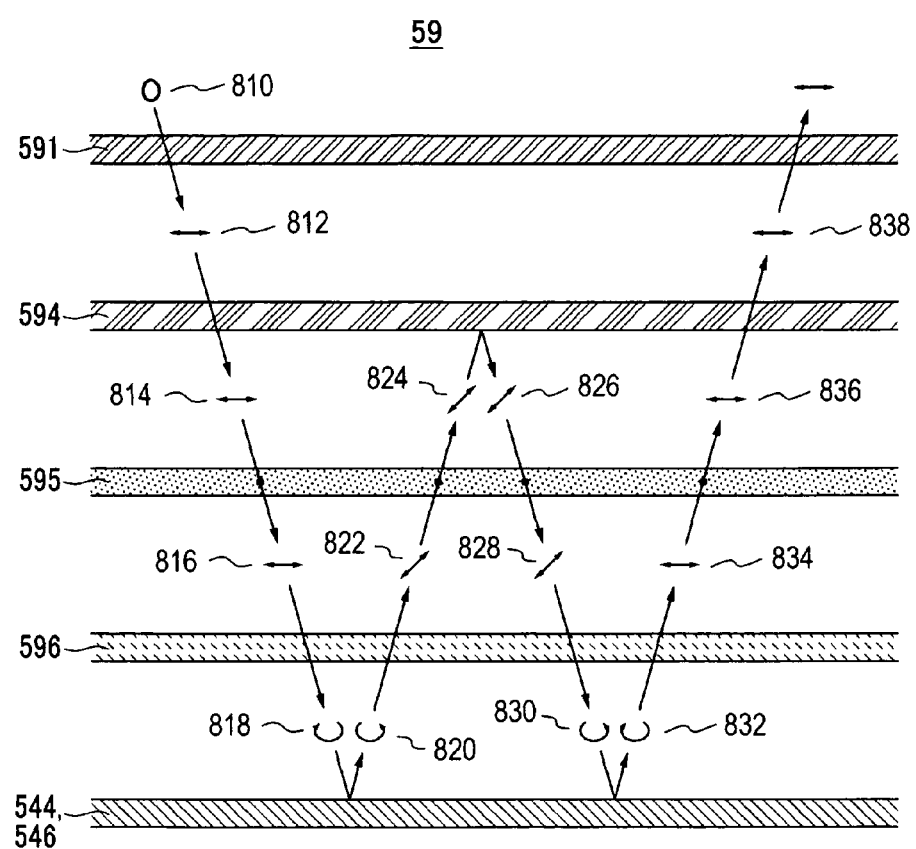
FIG. 6 is a configuration diagram illustrating the path of the light inputted into the organic light emitting diode display device of FIG. 5.

Hereinafter, referring to FIGS. 6 and 7, a principle will be described in which optical member 59 of organic light emitting diode display device 200 according to the second exemplary embodiment of the present invention minimizes the loss of the light emitted from organic emission layer 545 to the outside while effectively suppressing the external light reflection.

First, referring to FIG. 6, the path of light, which is inputted from the outside through optical member 59, will be described.

External light 810 is linearly polarized in a polarization-axis direction of polarizing plate 591 while passing through polarizing plate 591. Linear polarized light 812 goes toward transmittance control layer 595 through dual brightness enhancement film 594 without substantial loss.

After linear polarized light 814 passing through dual brightness enhancement film 594 is partially eliminated while passing through transmittance control layer 595, linear polarized light 816 goes toward phase retardation plate 596. At this time, transmittance control layer 595 may equally absorb and eliminate some of the passing light for each wavelength band or selectively absorb and eliminate some of the passing light for each wavelength band in accordance with the kind of optical absorption material included in transmittance control layer 595.

Linear polarized light 816 passing through transmittance control layer 595 is converted into circular polarized light 818 through phase retardation plate 596 which is a ¼ wavelength plate. At this time, the optical axis of phase retardation plate 596 deviates from the polarization axis of dual brightness enhancement film 594 by 45 degrees. That is, the intersection angle between the optical axis of phase retardation plate 596 and the polarization axis of dual brightness enhancement film 594 is 45 degrees.

As such, since the intersection angle between the axial direction of the linear polarized light and the optical axis direction of phase retardation plate 596 is 45 degrees, linear polarized light 816 is converted into circular polarized light 818 while passing through phase retardation plate 596. At this time, circular polarized light 818 is right circular polarized light. However, the exemplary embodiment of the present invention is not limited thereto. Accordingly, the light passing through phase retardation plate 596 may be left circular polarized light.

Right circular polarized light 818 passing through phase retardation plate 596 is reflected by electrodes 544 and 546 of organic light emitting element L1 to thereby be converted into left circular polarized light 820 by a phase of 180 degrees. Further, the light may be reflected by various other metal wires in addition to electrodes 544 and 546 of organic light emitting element L1. In addition, left circular polarized light 820 passes through phase retardation plate 596 and transmittance control layer 595 in sequence again. Further, left circular polarized light 820 is converted into linear polarized light 822 while passing through phase retardation plate 596. At this time, linear polarized light 822 has an axial direction that deviates from the polarization axis of dual brightness enhancement film 594 by 90 degrees. Accordingly, linear polarized light 824 passing through transmittance control layer 595 is reflected without passing through dual brightness enhancement film 594, and passes through transmittance control layer 595 and phase retardation plate 596 in sequence again. Further, linear polarized light 828 is converted into left circular polarized light 830 while passing through phase retardation plate 596.

Left circular polarized light 830 passing through phase retardation plate 596 is reflected by electrodes 544 and 546 of organic light emitting element L1 or various other metal wires to thereby be converted into right circular polarized light 832. In addition, right circular polarized light 832 passes through phase retardation plate 596 and transmittance control layer 595 in sequence again. Further, right circular polarized light 832 is converted into linear polarized light 834 again while passing through phase retardation plate 596. At this time, linear polarized light 834 has the same axial direction as the polarization axis of dual brightness enhancement film 594. Therefore, linear polarized light 834 is emitted to the outside while passing through dual brightness enhancement film 594 and polarizing plate 591 in sequence.

As such, after the external light passes through optical member 59, the external light passes through transmittance control layer 595 a total of four times when the external light is reflected by electrodes 544 and 546 of organic light emitting element L1 or various other metal wires, and goes toward the outside through optical member 59. That is, a large amount of external light is eliminated several times while passing through transmittance control layer 595.

At this time, transmittance control layer 595 may selectively absorb only light of a predetermined wavelength band among the passing external light.

By this configuration, organic light emitting diode display device 200 may suppress the external light reflection.

Figure 7:
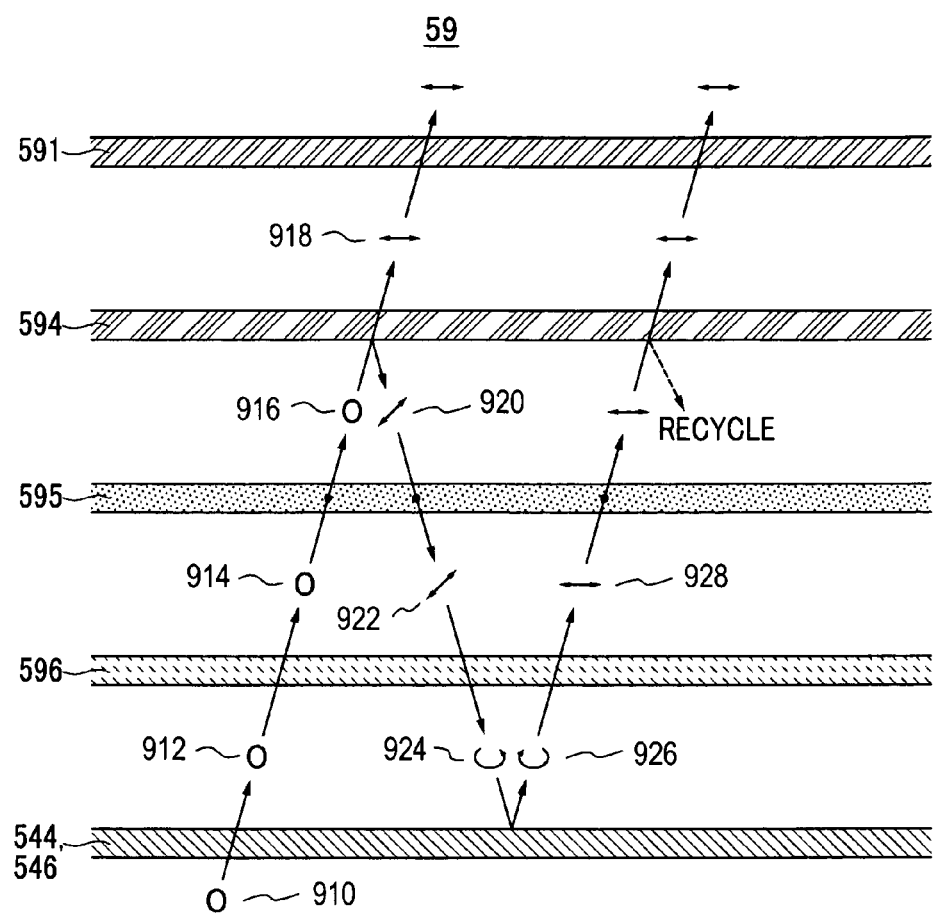
FIG. 7 is a configuration diagram illustrating the path through which the light generated from the organic light emitting element of the organic light emitting diode display device of FIG. 5 is emitted to the outside.

Referring to FIG. 7, the path of the light emitted from organic emission layer 545 (shown in FIG. 1) to the outside will be described.

Light 910 emitted from organic emission layer 545 goes toward dual brightness enhancement film 594 while passing through second electrode 546, phase retardation plate 596, and transmittance control layer 595 in sequence. At this time, various phases coexist in the light. Further, the light is partially eliminated while passing through transmittance control layer 595.

Light 918 having the same component as the polarization axis of dual brightness enhancement film 594 among light 916 passing through transmittance control layer 595 passes through dual brightness enhancement film 594 and the rest 920 is reflected to go toward transmittance control layer 595. Herein, light 918 passing through dual brightness enhancement film 594 is linearly polarized. In addition, linearly polarized light 918 is emitted to the outside by passing through polarizing plate 591 without substantial loss. Meanwhile, light 920 that is reflected by dual brightness enhancement film 594 goes toward electrodes 544 and 546 of organic light emitting element L1 or various other metal wires by passing through transmittance control layer 595 and phase retardation plate 596 in sequence. Light 922 may be converted into circular polarized light 924 while passing through phase retardation plate 596. Circular polarized light 924 has a phase shift at 180 degrees while being reflected by electrodes 544 and 546 of organic light emitting element L1 or various other metal wires, and thereafter circular polarized light 926 is linearly polarized while passing through phase retardation plate 596 again. At this time, linear polarized light 928 has the same axial direction as the polarization axis of dual brightness enhancement film 594. Therefore, linear polarized light 928 is thereafter emitted to the outside while passing through transmittance control layer 595, dual brightness enhancement film 594, and polarizing plate 591 in sequence.

By this configuration, in the case of organic light emitting diode display device 200 according to the second exemplary embodiment of the present invention, when the light inputted from the outside is emitted to the outside again by being reflected, the external light passes through transmittance control layer 595 a total of four times, while the light generated from organic light emitting element L1 passes through transmittance control layer 595 either once or three times. That is, transmittance control layer 595 has a large advantage of suppressing the external light reflection, while the amount of light lost in transmittance control layer 595 is relatively low when the light generated from organic light emitting element L1 is emitted to the outside. Accordingly, while organic light emitting diode display device 200 effectively suppresses the external light reflection, the light generated from organic light emitting element L1 is emitted to the outside with a relatively low loss by passing through optical member 59.

Further, organic light emitting diode display device 200 can efficiently emit the light generated from organic emission layer 545 to the outside to thereby improve luminance, reduce power consumption, and extend the lifespan.

Hereinafter, referring to the following table, optical characteristics of Experimental Example 1, Experimental Example 2, and a comparative example will be described.

The comparative example includes a polarizing plate and a phase retardation plate that have a general structure. Meanwhile, Experimental Example 1 further includes transmittance control layer 585 and cholesteric liquid crystal layer 583 according to the first exemplary embodiment of the present invention, and Experimental Example 2 further includes transmittance control layer 595 and dual brightness enhancement film 594 according to the second exemplary embodiment of the present invention.

TABLE 1

|  | Comparative Example | Experimental Example 1 | Experimental Example 2 |
|---|---|---|---|
| Transmittance [%] | 44.9 | 54.9 | 55.4 |
| Reflectance [%] | 4.6 | 8.5 | 8.8 |

As shown in Table 1, Experimental Example 1 and Experimental Example 2 show comparatively higher transmittance than the comparative example by 10% or more. On the contrary, Experimental Example 1 and Experimental Example 2 show higher reflectance than the comparative example. That is, Experimental Example 1 and Experimental Example 2 suppress the external light reflection less effectively than the comparative example. Since Experimental Example 1 and Experimental Example 2 have reflectance of 10% or less, the external light reflection does not, however, influence the visibility.

As shown in Table 1, although Experimental Example 1 and Experimental Example 2 have slightly increased reflectance in comparison with the comparative example, the slightly increased reflectance does not influence the visibility, and Experimental Example 1 and Experimental Example 2 have comparatively higher transmittance than the comparative example by 10% or more.

Accordingly, Experimental Example 1 and Experimental Example 2 can improve luminance, reduce power consumption, and extend the lifespan in comparison with the comparative example while properly suppressing the external light reflection.

Hereinafter, referring to FIG. 8, an experimental result in the transmittances of transmittance control layers 585 and 595 for each wavelength band will be described. An experiment is performed by changing the kind and content of the light absorption material included in the transmittance control layer.

Figure 8:
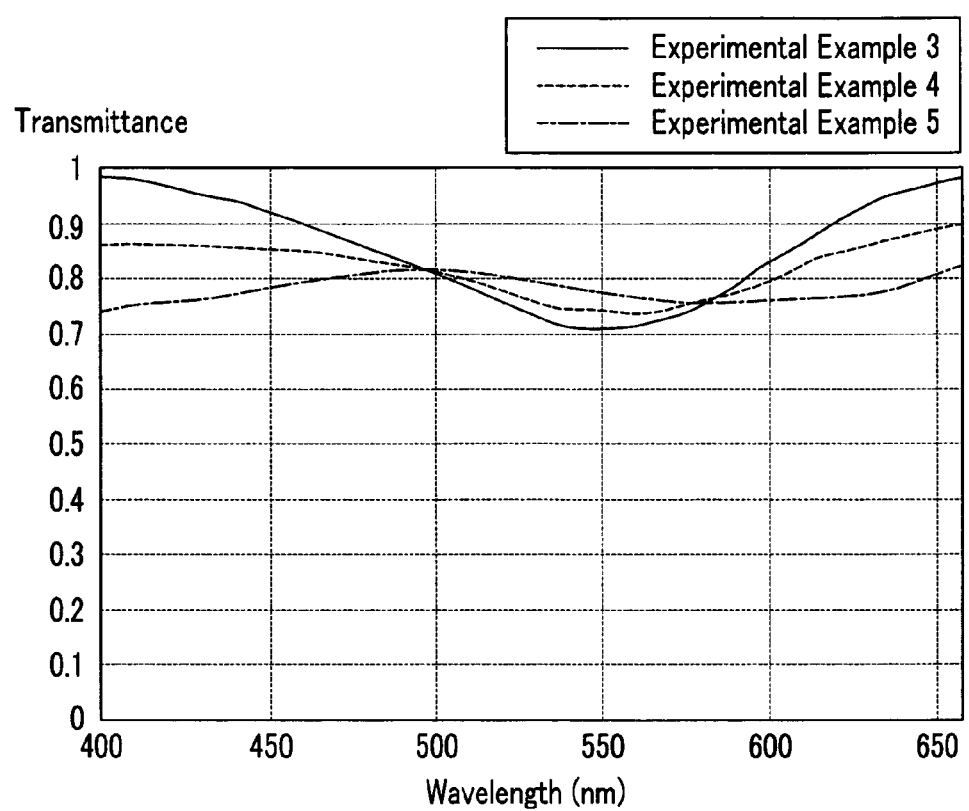
FIG. 8 is a graph illustrating a transmittance distribution for each wavelength band of a transmittance control layer used for an organic light emitting diode display device according to the present invention.

FIG. 8 is a graph illustrating a transmittance distribution for each wavelength band of the transmittance control layer according to various experimental examples. As shown in FIG. 8, a transmittance control layer of Experimental Example 3 has high transmittance for blue- and red-based colors, but it has comparatively low transmittance for green-based colors.

In general, since the external light primarily has the green-based colors, the transmittance control layer of Experimental Example 3 can effectively suppress the external light reflection. Further, since the light generated from the organic light emitting element has fewer blue-based colors, the transmittance control layer of Experimental Example 3, which has comparatively high transmittance for the blue-based colors, may be effective.

Further, a transmittance control layer of Experimental Example 4 has comparatively high transmittance for the blue- and red-based colors and comparatively low transmittance for the green-based colors, similar to Experimental Example 3, but the transmittance control layer of Experimental Example 4 has a difference in transmittance among colors that is smaller than that of the transmittance control layer of Experimental Example 3.

Further, a transmittance control layer of Experimental Example 5 may have comparatively even transmittance for each color.

In this way, the transmittance control layer may be configured to have proper transmittance if needed by controlling the kind and content of the light absorption material included in the transmittance control layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
    an organic light emitting element comprising a first electrode, an organic emission layer, and a second electrode sequentially laminated together;
    a transmittance control layer formed on the organic light emitting element;
    a selective reflective layer formed on the transmittance control layer;
    a polarizing plate formed on the selective reflective layer; and
    a phase retardation plate disposed between the organic light emitting element and the polarizing plate, wherein
    the transmittance control layer is made of a resin containing a light absorption material, and the light absorption material comprises at least one of a polyene-based pigment, an azo-based pigment, a quinine-based pigment, an indigo-based pigment, and a quinacridone-based pigment; and
    the polyene-based pigment includes at least one of compounds of the following Chemical Formulas 1 and 2:

Chemical Formula 1

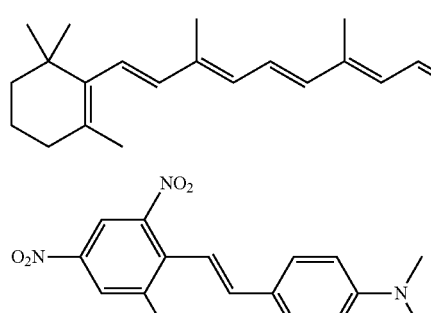

Chemical Formula 2

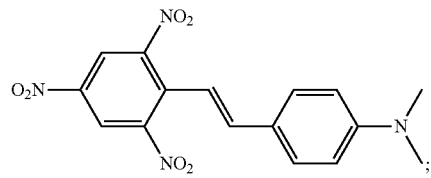

the azo-based pigment includes a compound of the following Chemical Formula 3:

Chemical Formula 3

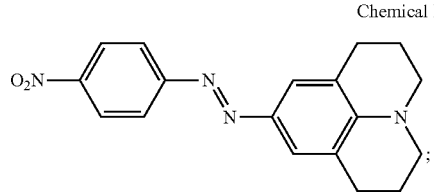

the quinacridone-based pigment includes at least one of compounds of the following Chemical Formulas 4 and 5:

Chemical Formula 4

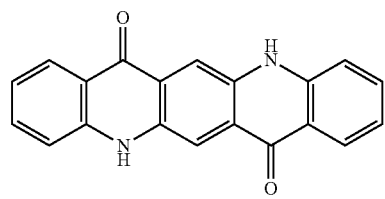

Chemical Formula 5

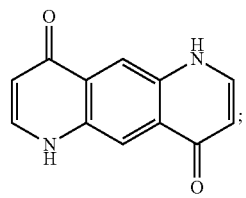

the quinine-based pigment includes at least one of compounds of the following Chemical Formulas 6 to 8:

Chemical Formula 6

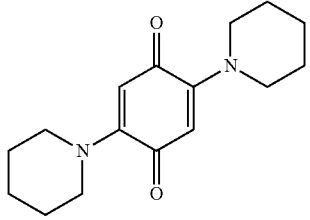

Chemical Formula 7

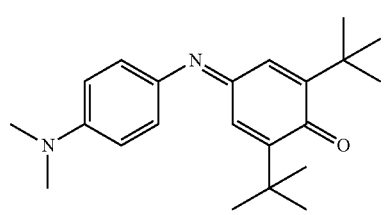

Chemical Formula 8

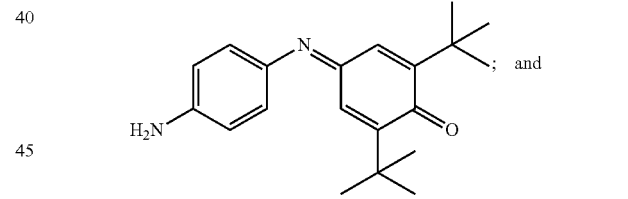

; and the indigo-based pigment includes at least one of compounds of the following Chemical Formulas 9 to 11:

Chemical Formula 9

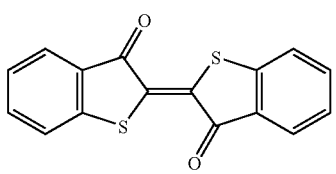

Chemical Formula 10

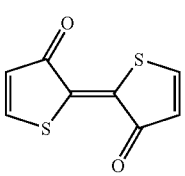

-continued

Chemical Formula 11

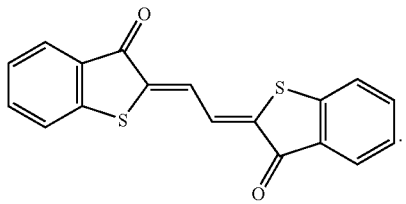

2. The organic light emitting diode display device of claim 1, wherein
the selective reflective layer is a cholesteric liquid crystal layer, and
the phase retardation plate is disposed between the polarizing plate and the cholesteric liquid crystal layer.

3. The organic light emitting diode display device of claim 2, wherein
the cholesteric liquid crystal layer passes one of left circular polarized light and right circular polarized light and reflects the other one of the left circular polarized light and the right circular polarized light.

4. The organic light emitting diode display device of claim 3, wherein
light that is linearly polarized through the polarizing plate is converted into circular polarized light while passing through the phase retardation plate.

5. The organic light emitting diode display device of claim 4, wherein
the phase retardation plate is a ¼ wavelength plate, and
an intersection angle between an optical axis of the phase retardation plate and a polarization axis of the polarizing plate is 45 degrees.

6. The organic light emitting diode display device of claim 1, wherein
the selective reflective layer is a dual brightness enhancement film, and
the phase retardation plate is disposed between the organic light emitting element and the transmittance control layer or between the transmittance control layer and the dual brightness enhancement film.

7. The organic light emitting diode display device of claim 6, wherein
the polarizing plate has the same polarization axis as the polarization axis of the dual brightness enhancement film.

8. The organic light emitting diode display device of claim 7, wherein
light that is linearly polarized through the dual brightness enhancement film is converted into the circular polarized light while passing through the phase retardation plate.

9. The organic light emitting diode display device of claim 8, wherein
the phase retardation plate is the ¼ wavelength plate, and
the intersection angle between the optical axis of the phase retardation plate and the polarization axis of the polarizing plate is 45 degrees.

10. The organic light emitting diode display device of claim 1, wherein
transmittance of light of the transmittance control layer is controlled depending on the kind and content of the light absorption material.

11. The organic light emitting diode display device of claim 1, wherein
the transmittance control layer has a selective transmittance for each wavelength band of light.

12. The organic light emitting diode display device of claim 1, wherein
the resin includes at least one of polycarbonate, polymethyl methacrylate (PMMA), polyether sulfone (PES), polyethylene terephthalate (PET), and triacetate cellulose (TAC).

13. An organic light emitting diode (OLED) display device, comprising:
an organic light emitting element comprising a first electrode, an organic emission layer, and a second electrode sequentially laminated together;
a transmittance control layer formed on the organic light emitting element;
a selective reflective layer formed on the transmittance control layer;
a polarizing plate formed on the selective reflective layer; and
a phase retardation plate disposed between the organic light emitting element and the polarizing plate, wherein
the transmittance control layer is made of a resin containing a light absorption material, and the light absorption material comprises aromatic hydrocarbons, the aromatic hydrocarbons comprise at least one of compounds of Chemical Formulas 12 to 18:

Chemical Formula 12

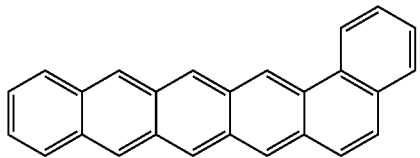

Chemical Formula 13

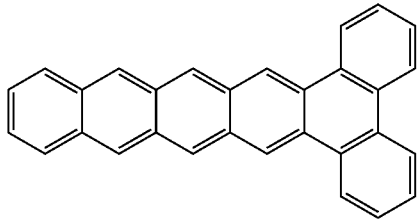

Chemical Formula 14

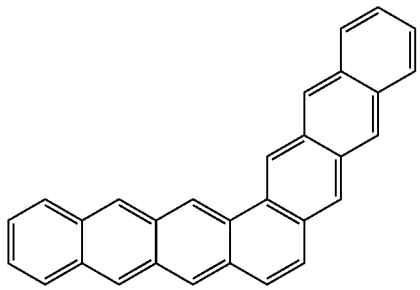

-continued
Chemical Formula 15
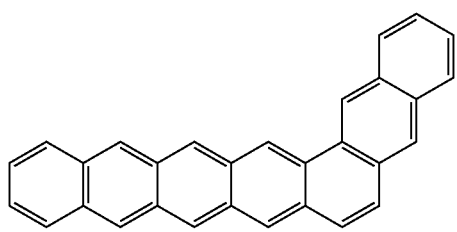
Chemical Formula 16
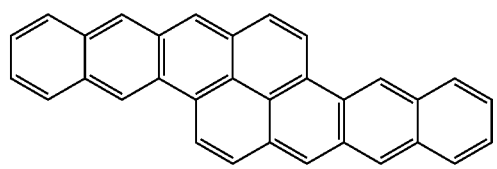
-continued
Chemical Formula 17
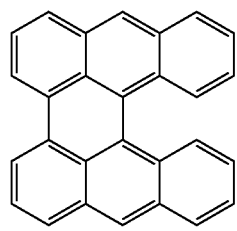
Chemical Formula 18
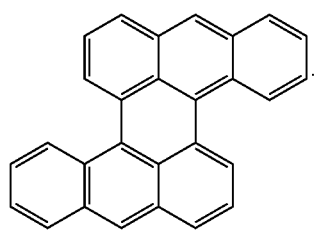
* * * * *